United States Patent
Sawahata

(10) Patent No.: US 6,429,490 B2
(45) Date of Patent: Aug. 6, 2002

(54) PROTECTION DEVICE AND PROTECTION METHOD FOR SEMICONDUCTOR DEVICE

(75) Inventor: Kouichi Sawahata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/726,313

(22) Filed: Dec. 1, 2000

(30) Foreign Application Priority Data

Dec. 3, 1999 (JP) .............................. 11-345401

(51) Int. Cl.[7] .......................... H01L 23/62; H01L 29/76; H01L 29/00
(52) U.S. Cl. ................. 257/356; 257/355; 257/342; 257/370; 257/374; 257/513
(58) Field of Search .................. 257/342, 355, 257/356, 360, 361, 370, 374, 509, 511, 513

(56) References Cited

U.S. PATENT DOCUMENTS

| | | | | |
|---|---|---|---|---|
| 4,470,062 A | * | 9/1984 | Muramatsu | 357/50 |
| 5,045,904 A | * | 9/1991 | Kobayashi et al. | 357/23.6 |
| 5,504,362 A | * | 4/1996 | Pelella et al. | 257/357 |
| 5,731,941 A | * | 3/1998 | Hargrove et al. | 361/56 |
| 5,945,713 A | * | 8/1999 | Voldman | 257/355 |
| 5,985,722 A | * | 11/1999 | Kishi | 438/275 |

FOREIGN PATENT DOCUMENTS

JP   11-74459   3/1999

* cited by examiner

Primary Examiner—Jerome Jackson, Jr.
Assistant Examiner—Joseph Nguyen
(74) Attorney, Agent, or Firm—Foley & Lardner

(57) ABSTRACT

On one side of a shallow trench isolation region formed on the surface of a p type well, an n type source region is provided while on the other side thereof, an n type drain region is provided so as to sandwich the shallow trench isolation region. In the drain region, a bent portion to allow a breakdown current to flow is provided and connected to a gate of a MOSFET comprising a circuit to be protected. Furthermore, a well contact connected to the source region is formed on the well surface and this well contact is grounded. When a positive high voltage which is higher than a predetermine voltage is applied to the drain region, since electric fields concentrate at the bent portion, a breakdown current flows from this bent portion toward the well contact. Thereafter, a current flows between the source and the drain.

8 Claims, 4 Drawing Sheets

PROTECTION DEVICE AND PROTECTION METHOD FOR SEMICONDUCTOR DEVICE

BACKGROUND OF THE INVENTION

1. Field of the Invention

The present invention relates to a protection device and a protection method for semiconductor device and, in particular, to a protection device and a protection method for semiconductor device which has excellent resistance to an electrostatic breakdown due to electrostatic discharge (ESD).

2. Description of the Related Art

FIG. 1 is a schematic sectional view showing a conventional MOSFET (metal oxide semiconductor field effect transistor). As shown in FIG. 1, a gate insulation film 101 and a gate electrode 102 are formed on a p type semiconductor layer 100 and on the side thereof, a sidewall 103 is formed. Then, an n type diffusion layer 104 to be a source and an n type diffusion layer 105 to be a drain are formed on the surface of a semiconductor layer 100 at positions where the gate electrode 102 are sandwiched. Also, an NPN parasitic bipolar transistor 106 is comprised of the n type layer 104, the p type semiconductor layer 100, and the n type layer 105. When a positive electrostatic discharge (ESD) is applied to the drain (n type layer 105) of the transistor, a current flows from the drain to the p type semiconductor layer 100 in the direction shown by the arrow a of FIG. 1 and a breakdown occurs. Then, a current flows, as shown by the arrow b of FIG. 1, toward the source (n type layer 104) from the drain and a bipolar action occurs. Then, during the bipolar action, the current concentrates in the vicinity of the surface flows. Since a course in the vicinity of the surface where the current flows is a portion where electric fields that generate around the drain are high, heat generation is concentrated to this portion and the temperature rises and there has been a problem such that an element is broken down when the temperature reaches the melting point of a material used for silicone or wiring.

Priory, an electrostatic protection circuit for protecting a circuit device from the electrostatic breakdown due to the ESD as mentioned above has been provided for a semiconductor integrated circuit. For example, Japanese Patent Laid-Open Publication No.Hei.11-74459 discloses an electrostatic protection circuit which has high surge absorbency without affecting current characteristics of a circuit to be protected.

In the electrostatic protection circuit as set forth in this publication, the protection circuit is connected to an output circuit which is composed of the p-channel MOS and n-channel MOS and has the CMOS of the LDD (lightly doped drain) structure. The protection circuit is composed of a diode with an n type diffusion layer of a high concentration formed on the p well surface, and the cathode thereof is connected to the output terminal while the anode is connected to the earth. Thus, the change in concentration is made steep at the pn junction, whereby the diode having a low breakdown voltage is formed. Also, in the output circuit which is the circuit to be protected, the n type impurities diffusion region to be the source and the n type high concentration impurities diffusion region and n type low concentration impurities diffusion region to be the drains are formed on the p well surface, and the n-channel MOS is formed of these diffusion layers and the gate formed on the p well surface. The source of this n-channel MOS is grounded and the drains are connected to the output terminal. Then, the parasitic diode, in which the cathode is connected to the output terminal and the anode is grounded, is comprised of the above described n type high concentration impurities diffusion region, the n type low concentration impurities diffusion region (drains), and the p well. Furthermore, the parasitic NPN bipolar transistor is formed of the above described n type high concentration impurities diffusion region, the n type low concentration impurities diffusion region (drains), the n type impurities diffusion region (source), and the p well. Thus, in the output circuit, a carrier concentration of the drain region is made low, whereby the diode having a high breakdown voltage is formed.

Accordingly, the semiconductor device having the prior-art electrostatic protection circuit thus constructed comprises the additional diode which starts breakdown at a voltage lower than the breakdown voltage of the parasitic diode in the output circuit, and therefore, the surge current can be absorbed before the parasitic diode in the output circuit breaks down.

SUMMARY OF THE INVENTION

The object of the present invention is to provide a protection device for semiconductor device in which resistance to an electrostatic breakdown is enhanced and a protection method for semiconductor device.

A protection device for semiconductor device according to the present invention comprises: a semiconductor substrate; a first conductive type well formed on the surface of said semiconductor substrate; a shallow trench isolation region formed on the surface of said first conductive type well; first and second diffusion layers of second conductive type formed on both sides of the shallow trench isolation region so as to sandwich the shallow trench isolation region, said second diffusion layer comprising a bent portion where electric fields concentrate and a breakdown current flows when a voltage which is higher than a predetermine voltage is applied to the second diffusion layer; and a first conductive type well contact formed on the surface of said first conductive type well and connected to said first diffusion layer.

In the protection device for semiconductor device according to the present invention, when a high voltage is applied to the second diffusion layer, the electric fields concentrate at the bent portion and the breakdown current flows between the bent portion and well contact, and then a voltage at a junction in the first diffusion layer rises, and a current flows between the first and second diffusion layers, however, since the bent portion is formed in the drain region, a breakdown current can flow at a low voltage, and therefore, heat generation due to a rise in voltage in the vicinity of the second diffusion layer can be suppressed and an element can be prevented from breaking down.

On the lower side of the second diffusion layer, a second conductive type electric field retrieving region with an impurity concentration lower than that of the second diffusion layer may be provided.

Also, the bottom portion of the first diffusion layer may be formed to a position deeper than the bottom portion of the second diffusion layer, or it may be formed to a position deeper than the bottom portion of the shallow trench isolation region.

Furthermore, a poly-silicon film may be provided to cover the upper portion of the bent portion.

A protection method for semiconductor device according to the present invention using a protection device for semiconductor device. Said protection device comprising a semiconductor substrate; a first conductive type well formed on the surface of said semiconductor substrate; a shallow trench isolation region formed on the surface of said first conductive type well; first and second diffusion layers of second conductive type formed on both sides of the shallow trench isolation region so as to sandwich the shallow trench isolation region, said second diffusion layer comprising a bent portion; and a first conductive type well contact formed on the surface of said first conductive type well and connected to said first diffusion layer. Said protection method comprises the step of: flowing a breakdown current between said bent portion and said well contact when a voltage which is higher than a predetermine voltage is applied to said second diffusion layer.

DETAILED DESCRIPTION OF THE PREFERRED EMBODIMENT

Figure 1:
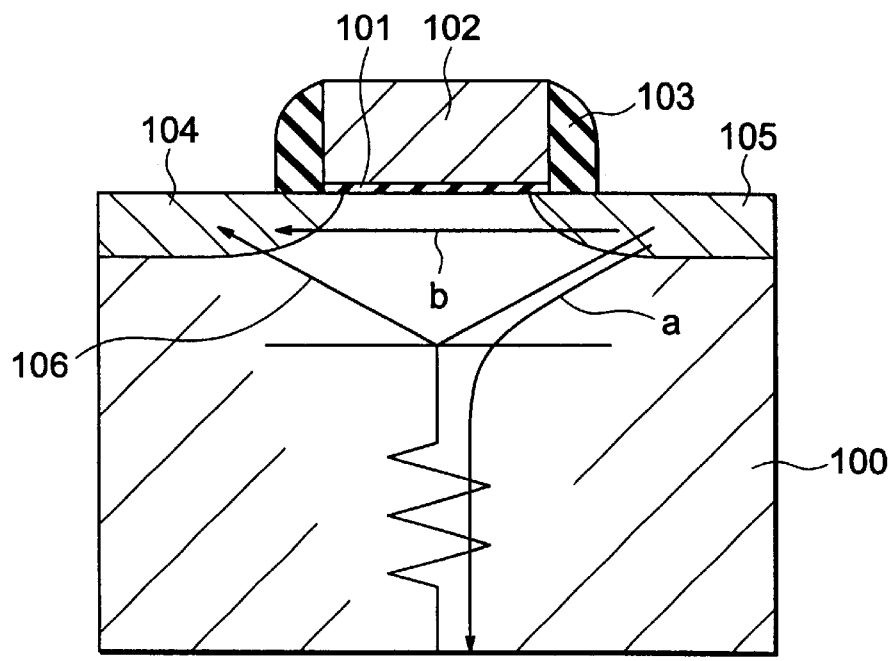
FIG. 1 is a schematic sectional view of a conventional MOSFET.
Figure 2:
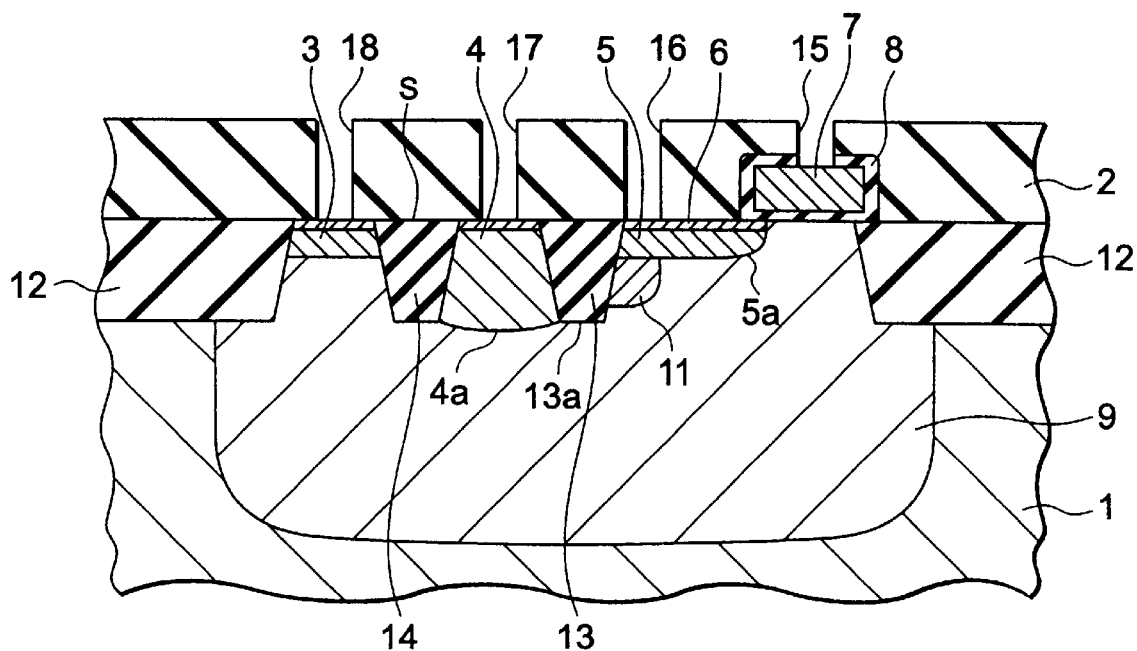
FIG. 2 is a sectional view showing a protection device for semiconductor device according to a first embodiment of the present invention.

Hereinafter, the protection device for semiconductor device according to embodiments of the present invention will be described in detail with reference to drawings hereto attached. FIG. 2 is a sectional view showing a protection device for semiconductor device according to a first embodiment of the present invention.

As shown in FIG. 2, shallow trench isolation (STI) regions 12 are formed on the surface of a p type semiconductor substrate 1 of a first conductive type, whereby an element region isolated from the other elements is formed. A p type well 9 is formed on the surface of the semiconductor substrate 1 of the element region. A plurality of STI regions 13 and 14 are formed on the surface of the p type well 9. Then, on one side of the STI region 13, a source region (a first diffusion layer) (hereinafter, referred to as a source) 4 to which n type impurities of the second conductive type are doped at a high concentration is provided, and on the another side across the STI region 13, similarly, a drain region (a second diffusion layer) (hereinafter, referred to as a drain) 5 to which n type impurities of the second conductive type are doped at a high concentration is provided. That is, the STI region 13 is formed on the p well surface at the position where a gate oxide film is formed between the source 4 and the drain 5. Furthermore, a $p^+$ well contact 3 to which impurities are doped at a concentration higher than that of the p well 9 is provided on the surface of the p well 9. Then, a suicide 6 is formed on the surface of the source 4, drain 5, and well contact 3, respectively. In the present embodiment, the shallow trench isolation region 14 is formed between the well contact 3 and the source 4. Then, the well contact 3 and the source 4 are connected and the well contact 3 is grounded (not shown). In addition, the drain 5 is connected to a gate of a MOSFET (not shown) which is a device to be protected by this protection circuit.

Furthermore, a bent portion 5a is provided on the bottom portion of the drain 5 on the side opposite to the side where the shallow trench isolation region 13 comes into contact with the drain 5, that is, on the side isolated from the source 4. When a positive high voltage is applied to the drain 5, it becomes possible to concentrate electric fields at the bent portion 5a and a breakdown current flows from the bent portion 5a.

Also, a bottom portion 4a of the source 4 which becomes a pn junction between the source 4 and the p well 9 is formed so as to be positioned in the vicinity of a bottom portion 13a of the shallow trench isolation region 13. Herein, if the bottom portion 4a of the source region 4 is formed from the substrate surface S up to a position deeper than the bottom portion 13a of the shallow trench isolation region 13, the operation speed can still be accelerated.

Moreover, a poly-silicon film 7 is formed on the position covering the upper portion of the bent portion 5a of the drain 5, and furthermore, a sidewall 8 is formed on the sides of the poly-silicon film 7. When n type impurity ions are doped to the drain 5 at a high concentration, the bent portion 5a can be formed below the poly-silicon film 7 using the poly-silicon film 7 and the sidewall 8 as a mask. This poly-silicon film is formed through the same process as for a gate poly-silicon film (not shown) of the MOSFET of the device to be protected which is concurrently formed with the protection device for a semiconductor device of the present invention. As a result, production of a protection circuit becomes easy. Incidentally, since this poly-silicon film 7 is provided for the purpose of forming the bent portion 5a of the drain 5, another means may be used as far as it can mask this portion. In addition, only the poly-silicon film 7 may be used as the mask.

Moreover, interlayer insulation film 2 is formed on the semiconductor substrate 1, contact holes 15 to 18 which are respectively connected to the poly-silicon film 7, drain 5, source 4, and well contact 3 are formed. Still furthermore, an n type electric field retrieving region 11, to which impurities are doped at a concentration lower than that of the drain 5, is formed at a position close to the source 4 of the drain 5 by ion implantation. The electric field retrieving region 11 is formed so as to make contact with the shallow trench isolation region 13. The electric field retrieving region 11 having an impurity concentration lower than that of the drain 5 is formed, and therefore the impurity concentration from the drain 5 to the p well 9 shows a gentle profile. The electric field retrieving region 11 can be formed by ion implantation via the contact hole 16 of the drain 5. Also, the electric field retrieving region 11 may be formed by implanting ions using a mask, etc. after the n type impurity ions are implanted to the drain 5 at a high concentration or before such implantation.

Figure 3:
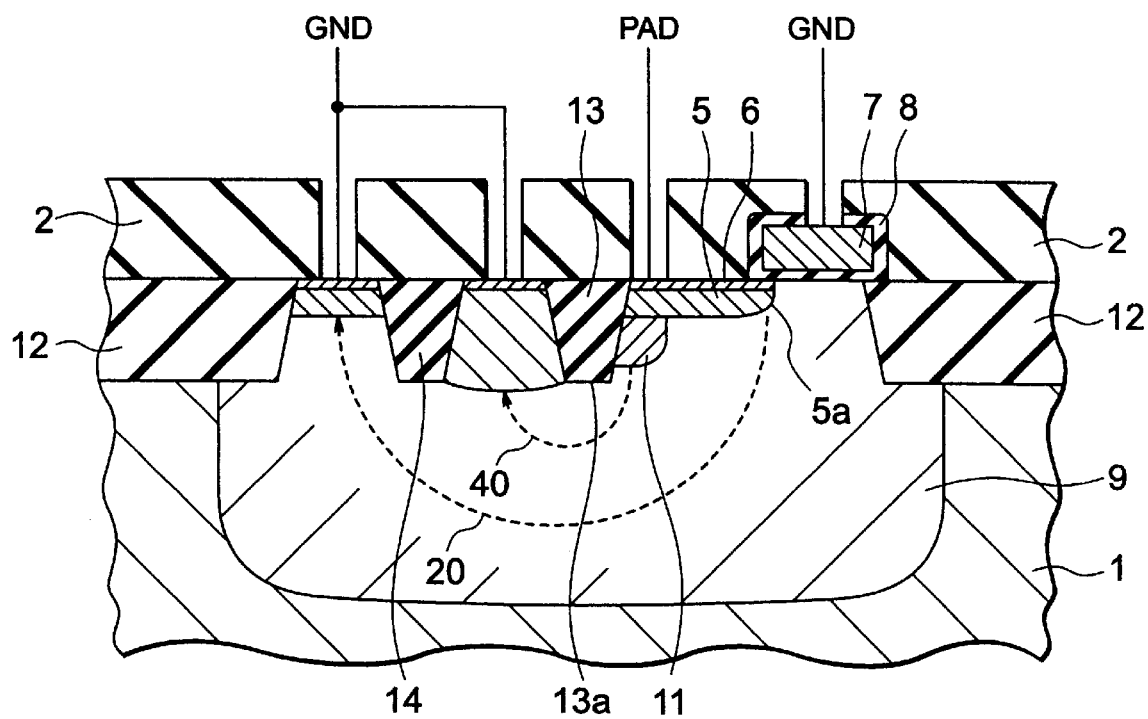
FIG. 3 is a schematic sectional view showing actions of a protection device for semiconductor device according to a first embodiment of the present invention.

Now, actions of the protection device for semiconductor device will be described. FIG. 3 is a schematic sectional view to explain the actions of the protection device for semiconductor device of the present embodiment. In the present embodiment, as shown in FIG. 3, the source 4 and the well contact 3 are short-circuited by means of wiring and they are connected to a ground (GND). Also, the poly-silicon film 7 is connected to a GND. Also, the drain 5 is connected to a PAD. The PAD is connected to the gate of the MOSFET, that is the device to be protected. Herein, for example, if the device to be protected is an input circuit, the gate of said MOSFET is an input terminal and if the device to be protected is an output circuit, the gate of said MOSFET is an output terminal.

First, in this condition, actions when a positive high voltage due to static electricity, etc. is applied between the drain 5 and the grand will be described. At this time, a voltage between the drain 5 and the p well 9 becomes a reverse voltage to the pn junction between the drain 5 and the p well 9. Therefore, high electric fields generate in a depletion layer produced in this pn junction. In this case, the voltage to be generated concentrates, in particular, at the bent portion 5a, where the junction is bent, close to the poly-silicon film 7. Therefore, if a breakdown occurs, it occurs at this bent portion. For the purpose of lowering the breakdown voltage, the portion of the junction of the drain 5 close to the poly-silicon film 7 is bent. As a result, before a breakdown of the element to be protected occurs, a protective element can be actuated to protect the element to be protected. Incidentally, by connecting the poly-silicon film 7 to the GND, the breakdown current can be made to flow at a lower voltage, however, the poly-silicon film 7 need not be connected to the GND. A breakdown then occurs, whereby carriers of electrons and holes are generated in bulk. Of the carriers generated around the junction of the drain 5, the electrons are drawn by a positive potential applied to the drain 5 and move toward the drain electrode side, whereas the holes move toward the well contact 3, and as a result, a breakdown trigger current 20 flows between the drain 5 and the well contact 3. When the current 20 flows between the drain 5 and the well contact 3, since resistance exists between the well contact 3 and the source 4, a voltage in the vicinity of the junction 4a of the source 4 rises.

Since the contact (wiring) of the source 4 is connected to the well contact 3 and a standard voltage of zero volts is provided, a forward bias is applied to the junction 4a of the source 4. If the forward bias exceeds the voltage necessary to make a forward current flow (usually approximately 0.7V), electrons are implanted from an $n^+$ region of the source 4 into the p well 9 and the electrons in the p well 9 are drawn by a high potential of the drain 5 and move to the vicinity of the electric field retrieving region 11. Thereafter, the electrons enter the electric field retrieving region 11 and flow into the drain. As a result, a current 40 of the bipolar actions flows.

A role of the electric field retrieving region 11 is to make the electric fields generating from the drain 5 to the junction of the electric field retrieving region 11 as low as possible. To make the electric fields low makes it possible for the electrons flowing into the drain 5 to consume electric power over a long distance. Therefore, heat can be prevented from concentratedly generating at the same place.

Herein, in the present embodiment, even though the electric field retrieving region 11 does not exist, the heat generation region can be dispersed compared to that of the protective element which has been priorly used. This is because, in the case of a MOS transistor priorly used as the protective element, most of its current flows through the place under the gate poly-silicon film where the electric fields are largest, whereas in the present invention, even though the electric field retrieving region 11 does not exist 11, the current 40 does not flow in the vicinity of the bent portion 5a under the poly-silicon film 7 where the electric fields are the highest.

Now, a role in which the position of the junction 4a of the source 4 is lower than the position of a bottom 13a of an STI region 13 will be explained. This is constructed, when the current 20 being generated due to a breakdown flows from the drain 5 toward the well contact 3, so that the current passes through the vicinity of the bottom portion 4a of the source 4 as the junction as much as possible. Such a construction is for making the current 40 generate from the source 4 as early as possible at a stage where the potential on the p well 9 side of the bottom portion 4a of the source 4 is low, that is, where the breakdown current 20 which flows toward the well contact 3 is as small as possible.

Thus, the protection method of the protection device for semiconductor device of the present invention in characterized in that, when a positive high voltage is applied to the p type drain 5, by concentrating the electric fields at the bent portion 5a provided in the drain 5, the breakdown current 20 flows between the bent portion 5a and the p type well contact connected to the source. Then, the voltage between the source 4 and the well contact 3 rises due to the breakdown current 20 and the well 9 and source 4 come into an ON state, whereby the electrons of the source 4 are drawn to the drain 5 and the current 40 flows between the source 4 and drain 5.

Consequently, the protection device for semiconductor device of the present invention is constructed, in comparison with the prior-art protective element, so that the current 40 flows through the portion of weak electric fields by avoiding the portion of high electrical fields formed by the breakdown 20, and therefore, resistance to an electrostatic breakdown can be enhanced.

Figure 4:
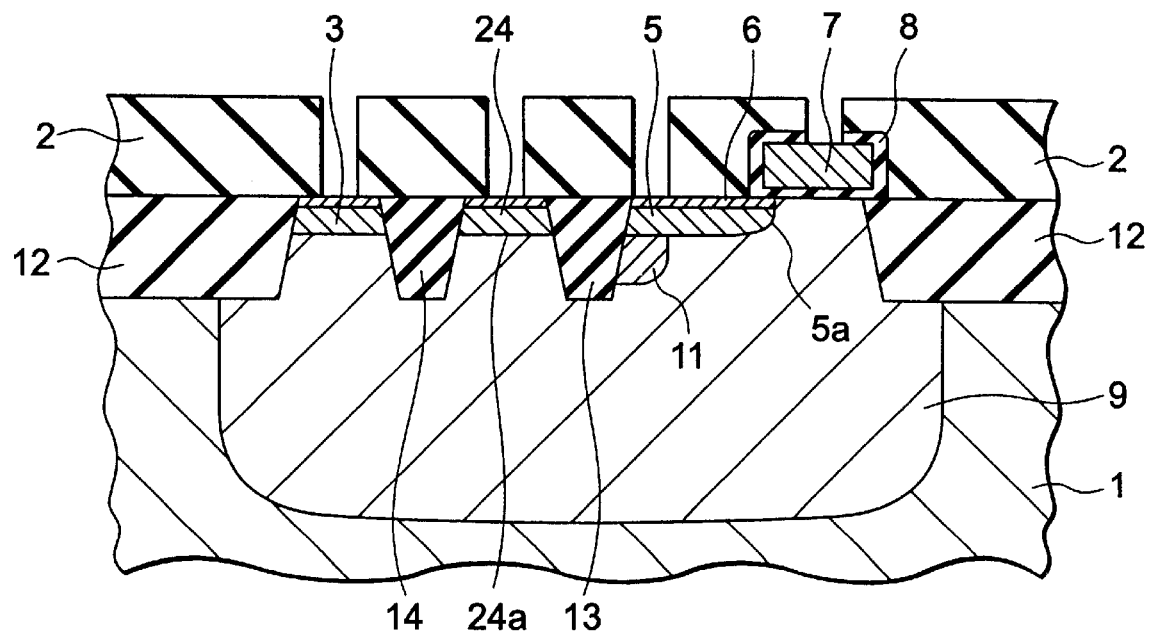
FIG. 4 is a sectional view showing a protection device for semiconductor device according to a second embodiment of the present invention.

Then, a second embodiment of the preset invention will be described. FIG. 4 is a sectional view showing a protection device for semiconductor device of the present invention. Herein, in the second embodiment shown in FIG. 4, the same symbols are used for the same components as those of the first embodiment shown in FIG. 2 and a detailed description thereof will be omitted. As mentioned above, the process becomes easy by forming the source 4 only by a method which is ordinarily used, that is, ion implantation for the source and drain. Accordingly, if there is no problem in its actions, as shown in FIG. 4, without performing the ion implantation to lower the junction of a source 24, the source 24 may be provided as an $n^+$ diffusion layer with a shallow depth similar to the drain 5.

In the present invention, a bottom portion 24a of the source 24 is made shallow to the same extent as the bottom portion of the drain 5, and therefore, resistance to an electrostatic breakdown becomes low compared to that of the first embodiment. However, its production processes become the same as of an ordinal MOS and the production processes are fewer and easier than those of the first embodiment, and therefore, it is advantageous in cost.

Figure 5:
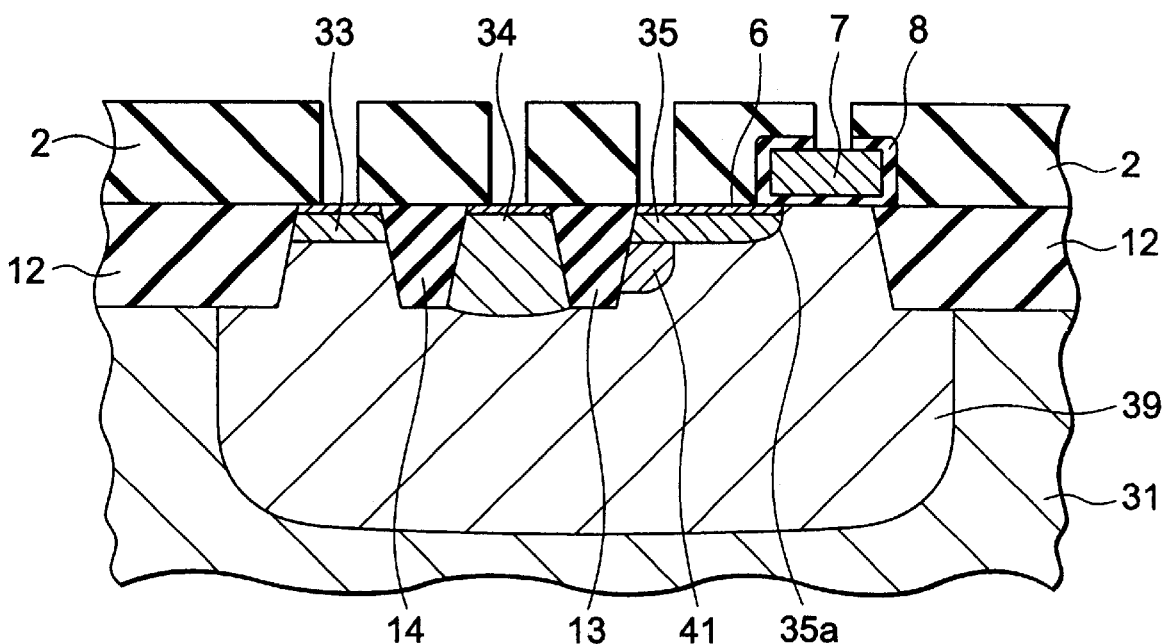
FIG. 5 is a sectional view showing a protection device for semiconductor device according to a third embodiment of the present invention.

Then, a third embodiment of the present invention will be described. FIG. 5 is a sectional view showing a protection device for semiconductor device of the present invention. Herein, in the third embodiment shown in FIG. 5, the same symbols are used for the same components as those of the first embodiment shown in FIG. 2 and a detailed description thereof will be omitted. In the first embodiment, the first conductive type is explained as the p type and the second conductive type is explained as the n type, however, as shown in FIG. 5, a p (carrier) type protection device for semiconductor device may easily be employed. That is, as shown in FIG. 5, a substrate 31 and an electric field retrieving region 41 are provided as the p type, furthermore, a source region 34 and a drain region 35 are provided as p+ diffusion layers to which impurities are doped at a concentration higher than that of the electric field retrieving region 41. Moreover, a well 39 is provided as the n type and the well contact 33 is provided as the n type with an impurity concentration higher than that of the well 39. The other constructions are similar to the constructions shown in FIG. 2. In the present embodiment, effects similar to those of the first embodiment can be produced.

Figure 6:
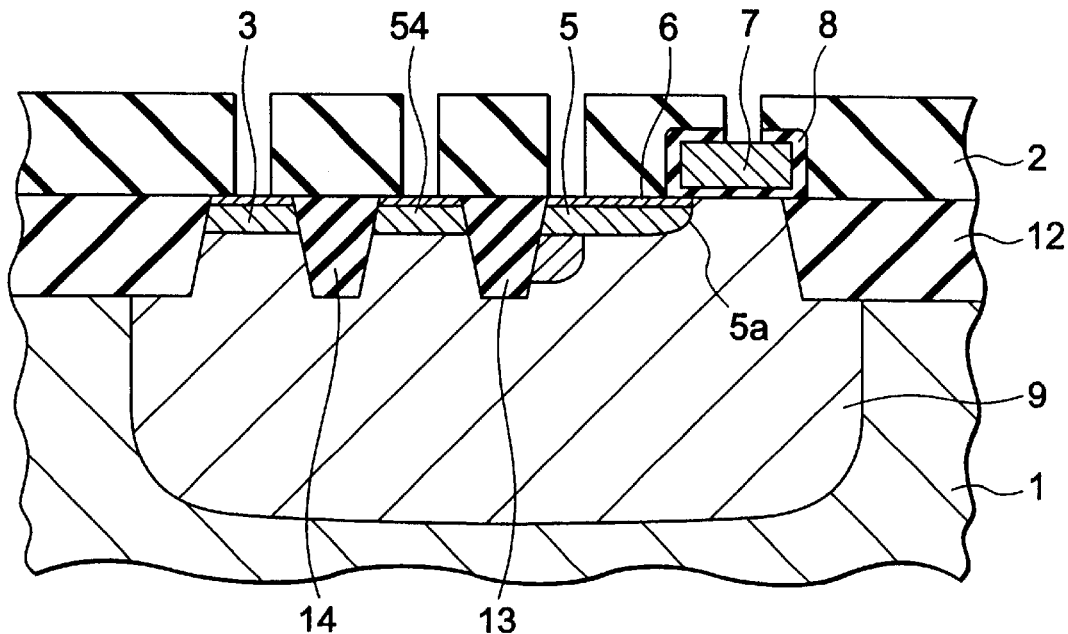
FIG. 6 is a sectional view showing a protection device for semiconductor device according to a fourth embodiment of the present invention.
Figure 7:
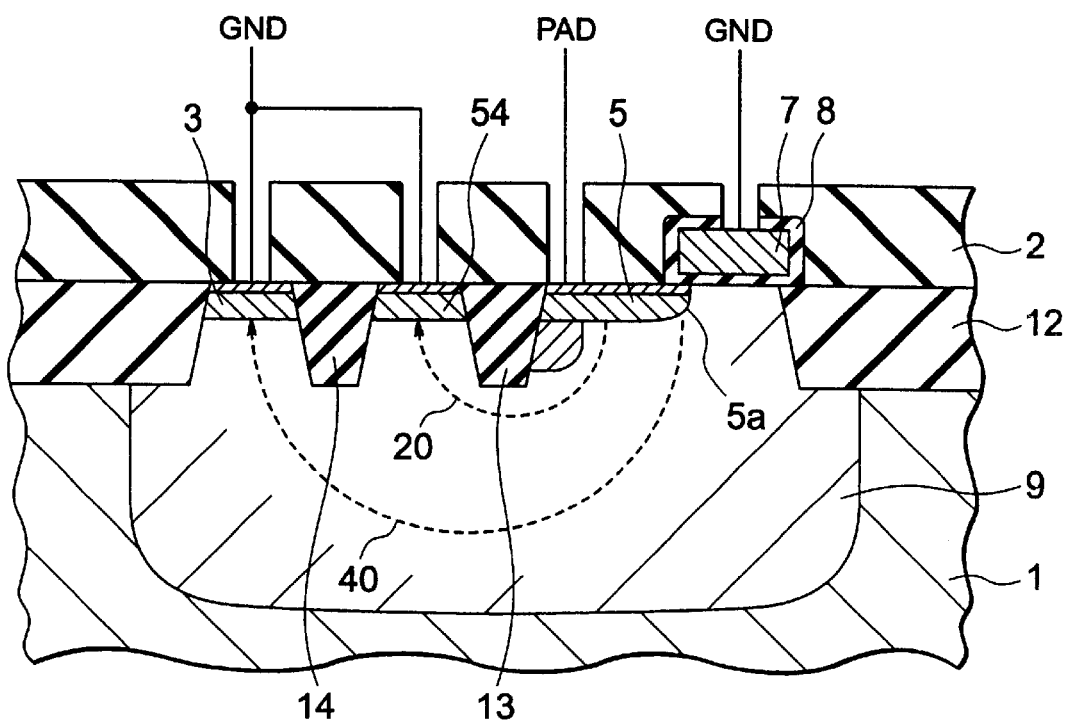
FIG. 7 is a schematic sectional view showing actions of a protection device for semiconductor device according to a fourth embodiment of the present invention.

Then, a fourth embodiment of the present invention will be described. FIG. 6 is a sectional view showing a protection device for semiconductor device of the fourth embodiment of the present invention. FIG. 7 is a schematic sectional view showing actions thereof. Herein, in the fourth embodiment shown in FIG. 6 and FIG. 7, the same symbols are used for similar constructions to those of the first embodiment shown in FIG. 2 and FIG. 3 and a detailed description thereof will be omitted.

As shown in FIG. 6, in the protection device for semiconductor device of the present embodiment, the electric field retrieving region 11 of the first embodiment shown in FIG. 2 is removed. In addition, a source 54 is formed by ion implantation in the same manner as for the drain 5 and the junction is made shallow compared to that of the first embodiment. As mentioned above, when the electric field retrieving region is not provided and the bottom portion of the source 54 is made shallow to the same extent as the bottom portion of the drain 5, it becomes disadvantageous in terms of resistance to an electrostatic breakdown. However, its production processes become the same as those of the ordinal MOS and the production processes become fewer and easier than those of the first embodiment, and therefore, it becomes advantageous in cost.

Also, as shown in FIG. 7, the p+ well contact 3 and the source 54 of an n+ diffusion layer are connected, they are connected to the GND, and the drain 5 of the n+ diffusion layer is connected to the PAD while the poly-silicon film is connected to the GND. Actions of the protection device for semiconductor device of the present embodiment thus connected are also similar to those of the first embodiment. That is, when a positive high voltage due to static electricity is applied to the drain 5, the current 40 flows from the curved portion 5a of the drain 5 to the well contact 3, and the current 20 then flows between the source 54 and the drain 5. Accordingly, with respect to resistance to the ESD, the current 40 due to the actions does not passes through the vicinity of the bent portion 5a with high electric fields formed below the poly-silicon film 7 but passes through the portion with small electric fields compared to that of the MOS structure which has been priorly used, and whereby resistance to the ESD can be enhanced.

What is claimed is:

1. A protection device for semiconductor device comprising:
    a semiconductor substrate;
    a first conductive type well formed on the surface of said semiconductor substrate;
    a shallow trench isolation region formed on the surface of said first conductive type well;
    first and second diffusion layers of second conductive type formed on both sides of the shallow trench isolation region so as to sandwich the shallow trench isolation region, said second diffusion layer comprising a bent portion where electric fields concentrate and a breakdown current flows when a voltage which is higher than a predetermine voltage is applied to the second diffusion layer; and
    a first conductive type well contact formed on the surface of said first conductive type well and connected to said first diffusion layer.

2. The protection device for semiconductor device according to claim 1, further comprising a second conductive type electric field retrieving region with an impurity concentration lower than that of said second diffusion layer provided on the lower side of said second diffusion layer.

3. The semiconductor protection according to claim 1, further comprising a poly-silicon film which covers the upper portion of said bent portion.

4. The semiconductor protection according to claim 1, wherein said second diffusion layer is connected to a gate electrode of a circuit to be protected.

5. The protection device for semiconductor device according to claim 2, wherein said electric field retrieving region is formed so as to contact with said shallow trench isolation region.

6. The protection device for semiconductor device according to claim 3, wherein the bottom portion of said first diffusion layer is positioned at a depth in the vicinity of the bottom portion of said shallow trench isolation region.

7. The protection device for semiconductor device according to claim 3, wherein the bottom portion of said first diffusion layer is formed at a position deeper than the bottom portion of said shallow trench isolation region.

8. A protection method for semiconductor device using a protection device, said protection device comprising a semiconductor substrate; a first conductive type well formed on the surface of said semiconductor substrate; a shallow trench isolation region formed on the surface of said first conductive type well; first and second diffusion layers of second conductive type formed on both sides of the shallow trench isolation region so as to sandwich the shallow trench isolation region, said second diffusion layer comprising a bent portion; and a first conductive type well contact formed on the surface of said first conductive type well and connected to said first diffusion layer, said protection method comprising the step of:
    flowing a breakdown current between said bent portion and said well contact when a voltage which is higher than a predetermine voltage is applied to said second diffusion layer.

* * * * *